US008724736B2

(12) United States Patent
Bellaouar et al.

(10) Patent No.: US 8,724,736 B2
(45) Date of Patent: May 13, 2014

(54) PASSIVE TRANSMITTER ARCHITECTURE WITH SWITCHABLE OUTPUTS FOR WIRELESS APPLICATIONS

(75) Inventors: Abdellatif Bellaouar, Richardson, TX (US); See Taur Lee, Allen, TX (US); Sher Jiun Fang, Allen, TX (US); Sherif H. K. Embabi, Plano, TX (US); Tajinder Manku, Waterloo (CA)

(73) Assignee: Icera, Inc., Wilmington, DE (US)

( * ) Notice: Subject to any disclaimer, the term of this patent is extended or adjusted under 35 U.S.C. 154(b) by 286 days.

(21) Appl. No.: 13/062,604

(22) PCT Filed: Sep. 8, 2009

(86) PCT No.: PCT/CA2009/001221
§ 371 (c)(1),
(2), (4) Date: Jun. 27, 2011

(87) PCT Pub. No.: WO2010/025556
PCT Pub. Date: Mar. 11, 2010

(65) Prior Publication Data
US 2011/0249770 A1    Oct. 13, 2011

Related U.S. Application Data

(60) Provisional application No. 61/094,713, filed on Sep. 5, 2008.

(51) Int. Cl.
*H04L 25/49* (2006.01)
(52) U.S. Cl.
USPC .......................................... 375/297; 375/258
(58) Field of Classification Search
USPC ................... 375/258, 295, 297, 299
See application file for complete search history.

(56) References Cited

U.S. PATENT DOCUMENTS

| 5,253,202 | A | 10/1993 | Bronner et al. |
| 7,323,945 | B2 | 1/2008 | Cyr et al. |
| 7,986,925 | B2 * | 7/2011 | Alford et al. ............... 455/115.1 |
| 2002/0146993 | A1 * | 10/2002 | Persico et al. ................ 455/126 |
| 2004/0090227 | A1 * | 5/2004 | Hiramatsu et al. ........ 324/207.18 |
| 2004/0246053 | A1 * | 12/2004 | Ashby et al. .................. 330/254 |
| 2005/0043006 | A1 * | 2/2005 | Bhatti et al. ................. 455/333 |
| 2005/0213672 | A1 * | 9/2005 | Lin et al. ....................... 375/257 |
| 2006/0114979 | A1 | 6/2006 | Pedersen et al. |
| 2006/0220758 | A1 * | 10/2006 | Rachedine et al. ........... 331/185 |
| 2007/0064633 | A1 * | 3/2007 | Fricke .......................... 370/310 |

(Continued)

FOREIGN PATENT DOCUMENTS

| EP | 0086463 | A2 | 2/1983 |
| EP | 1667335 | A2 | 12/2005 |

(Continued)

*Primary Examiner* — Emmanuel Bayard

(57) ABSTRACT

A transmitter architecture having a single signal path or hardware to cover WCDMA/EDGE/GSM applications, and requires no SAW at the transmitter outputs. The transmitter architecture allows for a transmit convergence feature. A passive mixer with unique driver and furthermore using native devices available from the CMOS process for the mixer cores enables low voltage and low power design, low output noise and high linearity. A digital variable gain amplifier has the capability to cover wide output dynamic range operated from low supply voltage and interfaced digitally with the baseband circuit without DAC. A single transformer is used to combine the outputs from the WCDMA/EDGE and GSM drivers and subsequently convert the differential signal paths into a single-ended signal. RF switches are used to divert the output from the transformer to different bands and applications.

24 Claims, 12 Drawing Sheets

(56) References Cited

U.S. PATENT DOCUMENTS

| | | |
|---|---|---|
| 2007/0087711 A1* | 4/2007 | Pan .............................. 455/127.4 |
| 2007/0257601 A1* | 11/2007 | Erchak et al. ................. 313/498 |
| 2009/0058552 A1* | 3/2009 | Oiwa .............................. 333/32 |
| 2009/0098831 A1* | 4/2009 | Deng et al. ...................... 455/73 |
| 2009/0117864 A1* | 5/2009 | Cassia et al. ............... 455/127.1 |
| 2009/0163157 A1* | 6/2009 | Zolfaghari ................. 455/127.1 |
| 2009/0179624 A1* | 7/2009 | Chen ............................ 323/282 |
| 2009/0268791 A1* | 10/2009 | Waheed et al. ............... 375/219 |
| 2009/0318100 A1* | 12/2009 | Pan ............................ 455/127.1 |
| 2010/0029227 A1* | 2/2010 | Narathong et al. ........ 455/127.1 |
| 2010/0033253 A1* | 2/2010 | Narathong et al. ........... 330/301 |
| 2010/0041353 A1* | 2/2010 | Alford et al. ................ 455/115.1 |
| 2010/0322323 A1* | 12/2010 | Hershbarger ................. 375/258 |
| 2012/0236958 A1* | 9/2012 | Deng et al. .................... 375/295 |

FOREIGN PATENT DOCUMENTS

| | | |
|---|---|---|
| WO | 2007033264 A1 | 3/2007 |
| WO | 2007147132 A2 | 12/2007 |
| WO | 2008139390 A1 | 5/2008 |
| WO | 2010025556 A1 | 3/2010 |

* cited by examiner

PASSIVE TRANSMITTER ARCHITECTURE WITH SWITCHABLE OUTPUTS FOR WIRELESS APPLICATIONS

CROSS-REFERENCE TO RELATED APPLICATION

This application is the National Stage of, and therefore claims the benefit of, International Application No. PCT/CA2009/001221 filed on Sep. 8, 2009, entitled "A PASSIVE TRANSMITTER ARCHITECTURE WITH SWITCHABLE OUTPUTS FOR WIRELESS APPLICATIONS," which was published in English under International Publication Number WO 2010/025556 on Mar. 11, 2010, and has a priority date of Sep. 5, 2008, based on U.S. Provisional Application Ser. No. 61/094,713. Each of the above applications is commonly assigned with this National Stage application and is incorporated herein by reference in their entirety.

FIELD OF THE INVENTION

The present invention relates generally to wireless transceivers. More particularly, the present invention relates a transmitter circuit of a wireless transceiver.

BACKGROUND OF THE INVENTION

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a base band processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18. Those of skill in the art should understand that FIG. 2 is a simplified block diagram, and can include other functional blocks that may be necessary to enable proper operation or functionality.

Generally, the transmitter core 20 is responsible for up-converting electromagnetic signals from base band to higher frequencies for transmission, while receiver core 16 is responsible for down-converting those high frequencies back to their original frequency band when they reach the receiver, processes known as up-conversion and down-conversion (or modulation and demodulation) respectively. The original (or base band) signal, may be, for example, data, voice or video. These base band signals may be produced by transducers such as microphones or video cameras, be computer generated, or transferred from an electronic storage device. In general, the high frequencies provide longer range and higher capacity channels than base band signals, and because high frequency radio frequency (RF) signals can propagate through the air, they are preferably used for wireless transmissions.

There are several different wireless communications standards that voice and data can be provided in. Such standards (referred to as modes) include WCDMA, EDGE and GSM for example, where each has different electrical and protocol specifications which must be followed. Currently, multi-mode and multi-band compatible transceivers, referred to simply as multi-standard transceivers, are desirable to enable every user equipment, such as a cellular phone, to function in different countries or with different service providers who operate with different communication standards.

Therefore, transceiver integrated circuits (IC) integrate various transmitters with either the same or different transmitter architectures for WCDMA/EDGE/GSM applications. Under tremendous pressure to ship products as quickly as possible to the market, these products lack sufficient research and development efforts, and consequently the IC is either not competitive on silicon area and/or power consumption. Some prior art designs have dedicated signal paths or hardware for each of the WCDMA/EDGE/GSM standards, and some may even have separate low-band and high-band signal paths. This results in larger silicon area of the transceiver chip, and higher power consumption. Recently, the system on chip (SOC) digital transceiver has become very popular, where multi-mode and multi-band radio with the baseband circuits are integrated together using low cost deep submicron CMOS fabrication technology, and operated from low supply voltage. In SOC designs, chip area consumption by the circuits is a significant cost factor since the chip is inherently increased in size over a dedicated transceiver chip or base band processor chip.

It is, therefore, desirable to provide a multi-standard transmitter core architecture that minimizes silicon area consumption.

SUMMARY OF THE INVENTION

It is an object of the present invention to obviate or mitigate at least one disadvantage of previous multi-mode and multi-band transmitter cores.

According to present aspect, the present invention provides a multi-standard transmitter core. The multi-standard core includes a filter, a mixer, a digital variable gain amplifier (DVGA), and a transformer. The filter receives and filters a differential transmission signal in accordance with a first standard of at least two different communication standards, the filter providing a differential filtered transmission signal. The mixer receives and upconverts the differential filtered transmission signal with an adjusted oscillator frequency for the first standard, the mixer providing a differential upconverted transmission signal. The DVGA receives the differential upconverted transmission signal and applies a gain factor to provide a first differential output signal for the first standard. The transformer selectively receives one of the first differential output signal and a second differential output signal corresponding to a second standard of the at least two different communication standards. The transformer having a primary coil and a secondary coil for converting one of the first differential output signal and the second differential output signal to a single-ended output signal.

In one embodiment, the multi-standard transmitter core further includes a digital driver circuit for providing the second differential output signal in response to a digital transmission signal. In this embodiment, a programmable divider is included for receiving a local oscillator frequency and converting the local oscillator frequency into the adjusted oscillator frequency for one of the passive mixer and the digital driver circuit. Alternately for this embodiment, the second standard is a GSM standard, and the digital driver circuit is a GSM driver circuit. In yet another alternate aspect of the present embodiment, the transformer includes a switch circuit for selectively connecting a voltage supply to a centre tap of the primary coil during operation of the first standard while disabling the digital driver circuit. The switch circuit enables the digital driver circuit during operation of the second standard while disconnecting the voltage supply from the centre tap. In another embodiment, the transformer includes tunable capacitances connected to inputs of the transformer.

In another embodiment of the present aspect, the mixer includes a driver circuit and a passive mixer, the driver circuit driving the differential filtered transmission signal through a passive mixer, the passive mixer receiving the adjusted oscillator frequency to provide the differential upconverted transmission signal. The driver circuit can include input stages for providing corresponding outputs to passive filters, the passive filters having outputs coupled to the passive mixer. Furthermore, the driver circuit includes inductors connected between the outputs of the passive filters and the passive mixer. In yet another embodiment of the present aspect, the DVGA includes a coarse gain block and a fine gain block. The coarse gain block provides a first current to differential output nodes in response to the differential upconverted transmission signal, the differential output nodes corresponding to the first differential output signal. The fine gain block provides a second current to the differential output nodes in response to the differential upconverted transmission signal, the gain of the first differential output signal being a sum of an integer factor of a received bias current and a fraction of the bias current. The coarse gain block can include a predetermined number of unit cells, each unit cell being selectively enabled to add one unit of the received bias current to the differential output nodes. The fine gain block can include a predetermined number of unit cells, each unit cell being selectively enabled to add one fraction of the received bias current to the differential output nodes. The fine gain block can include a first set of N transistors, a second set of N transistors, switch elements and an op-amp. The first set of N transistors are connected in parallel between the differential output nodes and input transistors receiving the differential upconverted transmission signal, where N is an integer number greater than 1. The second set of N transistors are connected in parallel between a voltage supply and the input transistors. The switch elements enable M transistors of the first set of N transistors, and enable N-M transistors of the second set of N transistors, where M is less than or equal to N. The op-amp receives the bias current and a common mode feedback signal from one of the input transistors for driving gate terminals of the enabled M transistors and the N-M transistors.

Furthermore, the DVGA can include a current block for adjusting the bias current. The current block includes a coarse current sub-block and a fine current sub-block. The coarse current sub-block provides a coarse current in response to a first bias voltage. The fine current sub-block provides a fine current in response to a second bias voltage different than the first bias voltage, the bias current being a sum of the coarse current and the fine current. The coarse current sub-block includes first individual current sources selectively enabled to provide the coarse current, and the fine current sub-block includes second individual current sources selectively enabled to provide the fine current.

According to other embodiments of the present aspect, the filter is programmable to adjust a corresponding corner frequency and Q parameter for the first standard, where the filter can be a PSKF filter. The multi-standard transmitter core can further include a first transmission switch corresponding to the first standard and a second transmission switch corresponding to the second standard, the single-ended output signal being passed through one of the first transmission switch and the second transmission switch. A decoder is provided for enabling at least one of the first transmission switch and the second transmission switch in response to an operating mode of the multi-standard transmitter core. Each of the first transmission switch and the second transmission switch can include a switch transistor for coupling the single-ended output signal to a transmission output when enabled by the decoder. In the present embodiment, the switch transistor is an NMOS transistor formed in a dedicated p-well, the p-well being formed in an n-well, and the n-well is formed in a p-substrate. The dedicated p-well is selectively coupled to one of a first noise resistant ground voltage and a second noise resistant ground voltage, and the p-well is connected to a VSS voltage supply. The n-well is selectively coupled to one of a first noise resistant positive voltage and a second noise resistant positive voltage. Each of the first transmission switch and the second transmission switch includes a voltage coupling circuit for selectively coupling the one of the first noise resistant positive voltage and the second noise resistant positive voltage to the n-well. The first noise resistant positive voltage being selected when the switch transistor is enabled by the decoder, and the second noise resistant positive voltage being selected when the switch transistor is disabled by the decoder.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention provides a fully integrated, low cost and SAW-less transmitter core for WCDMA/EDGE/GSM applications. The design uses a single path or set of hardware to realize multi-mode and multi-band functionality for WCDMA/EDGE/GSM applications. A multi-mode and multi-band transmitter is referred to as a multi-standard transceiver. Since the single path is reused for different modes and bands, minimum silicon area is consumed. A passive mixer using native devices enables low voltage design, and at the same time achieves low output noise and high linearity. A digital variable gain amplifier (DVGA) has the capability to cover a wide output dynamic range while operated from a low supply voltage and under the control of the baseband circuit without any intervening digital to analog converter (DAC). The output power of the DVGA changes linearly in dB with respect to the input codes through sizing of the transistors and/or manipulating of the bias current. A single transformer with tuning capabilities is used to combine the outputs from the WCDMA/EDGE and GSM drivers and subsequently convert the differential signals into a single-ended signal. RF switches with biasing techniques minimize loss and maintain acceptable isolation are used to divert the output from the transformer to different bands and applications.

Figure 1:
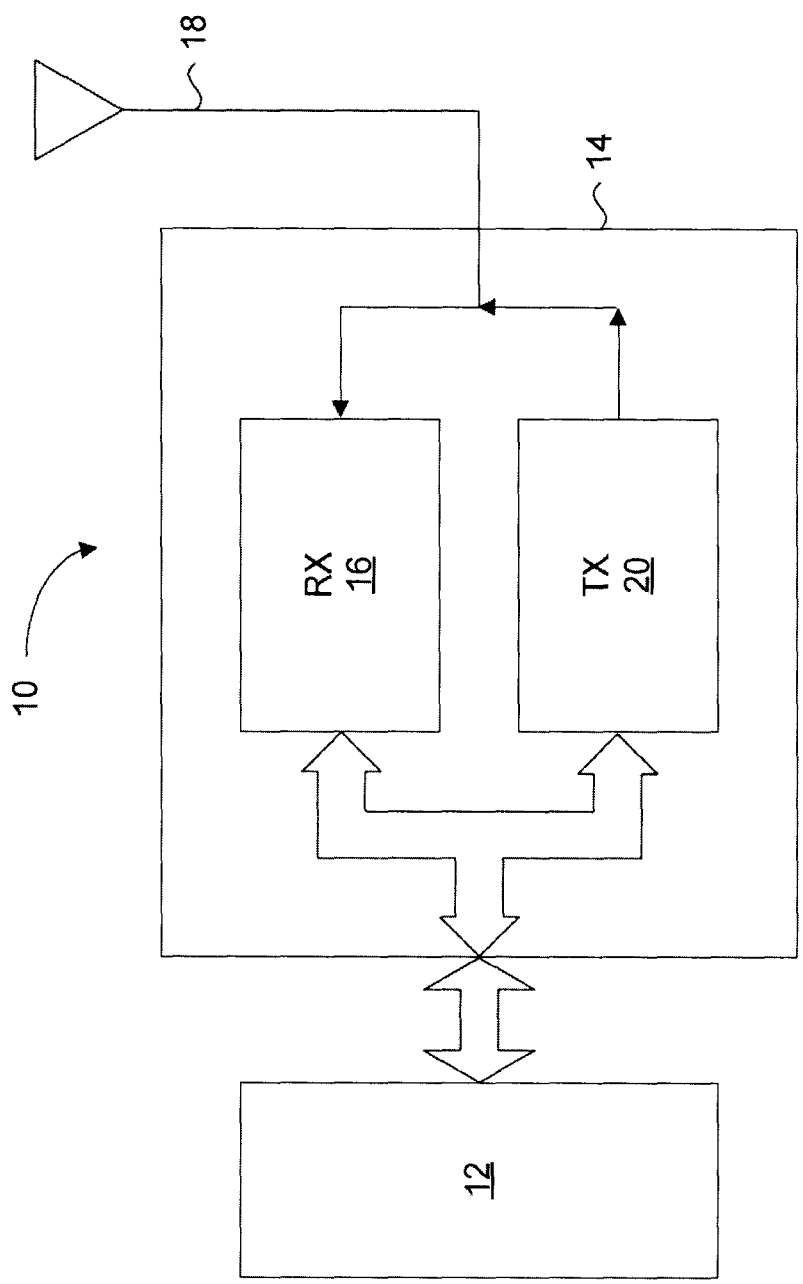
FIG. 1 is a block diagram of a wireless core of the prior art.
Figure 2:
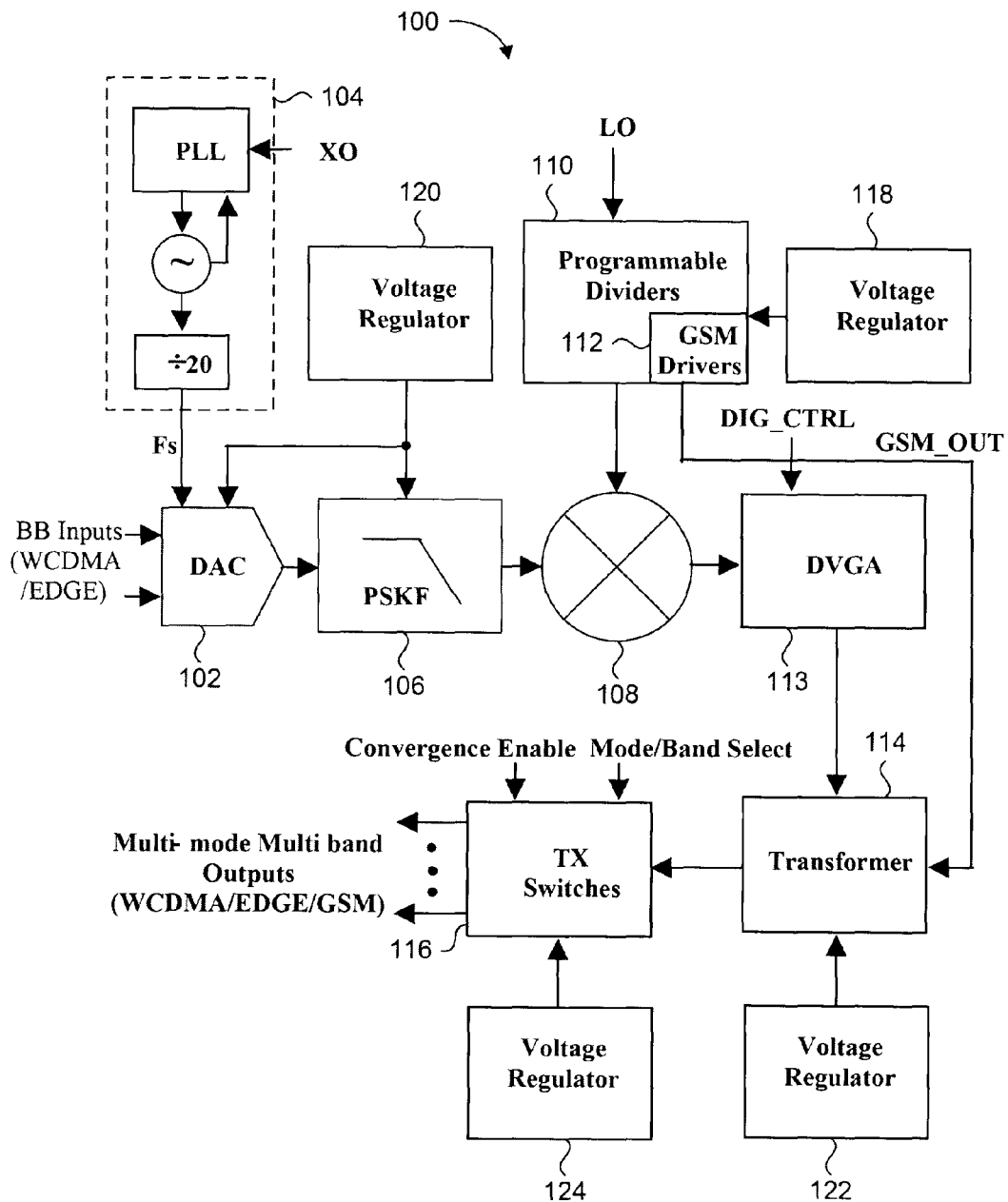
FIG. 2 is a block diagram of a universal SAW-less transmitter for WCDMA/EDGE/GSM applications, according to an embodiment of the present invention.

A conceptual block diagram of a universal multi-standard SAW-less transmitter core 100 according to a present embodiment is illustrated in FIG. 2. The digital baseband signals (WCDMA/EDGE) are first converted into analog signals via a DAC 102. The DAC 102 is clocked at a unique frequency (Fs), such as 249.6 MHz for example, where the harmonics generated from the clock do not fold into the desired band. Furthermore, due to its high sampling frequency, the filtering of the quantization noise and spurs are relaxed. The Fs is generated via an on-chip clock multiplier 104. The crystal oscillator (XO) input frequency can be a frequency of 19.2 MHz, 26 MHz or 38.4 MHz for example, when Fs is 249.6 MHz. The output from the DAC 102 is then filtered by a PSKF 106, and then provided to IQ mixers 108. The second-order Sallen-Key filter's corner is programmable to accommodate multi-mode and multi-band applications.

Figure 3:
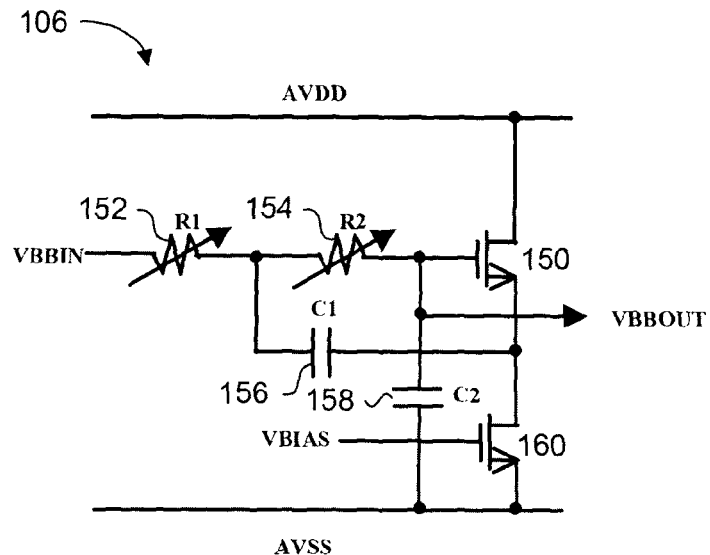
FIG. 3 is a circuit schematic of a single-ended PSKF shown in FIG. 2.

The schematic of a single-ended PSKF 106 is shown in FIG. 3. It is based on a source-follower design acting as a unity gain amplifier, namely NMOS transistor 150 with resistors 152 and 154 having values R1 and R2 respectively, capacitors 156 and 158 having values C1 and C2 respectively, and current source NMOS transistor 160. The baseband input is labeled VBBIN and the filtered output is labeled VBBOUT. Persons skilled in the art should understand that PSKF 106 can easily be adapted for differential signals. Most RF signaling is done with in-phase (I) and quadrature phase (Q) signals, where each can be differential in formats. Therefore, VBBOUT can be represented as I and Q signals, where each is differential in nature. In the present example, the output of PSKF 106 are denoted as VBBIP/VBBIM for the I signal and VBBQP/VBBQM for the Q signal. The corner frequency and the filter's Q are determined by the resistances of resistors 152 and 154, capacitances of capacitors 156 and 158, and the parasitic capacitance from NMOS transistor 150. By either varying the resistance or capacitance accordingly, the filter's corner is adjusted to suit different requirements for different modes of operations. Accordingly, the digital PSKF filter can be digitally programmable via the base band processor to adjust such resistance and capacitance values.

Figure 4:
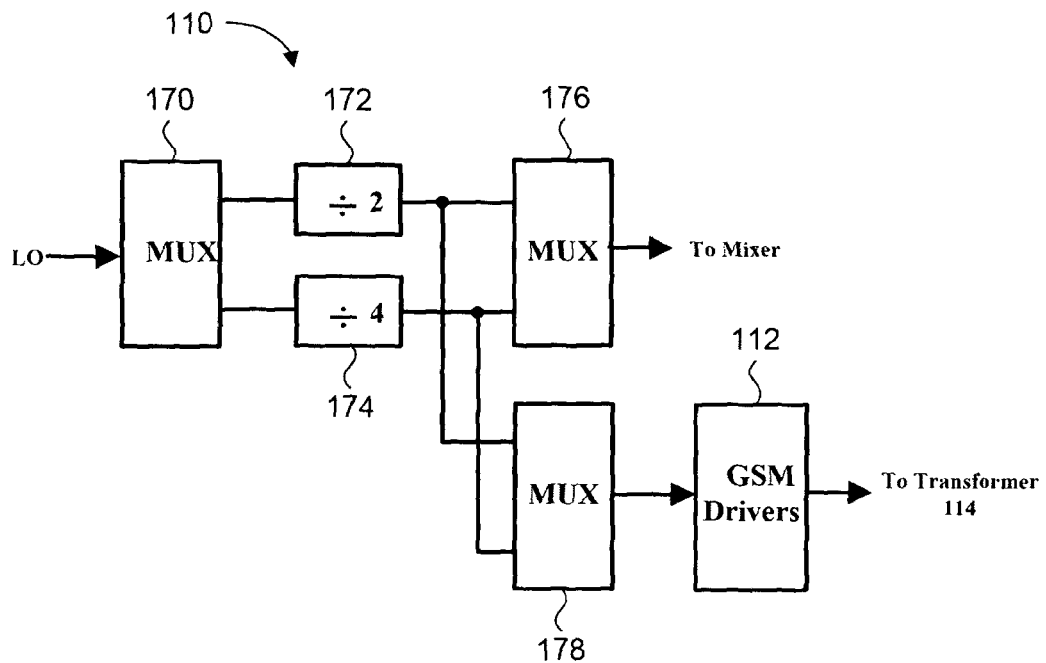
FIG. 4 is a block diagram of the programmable divider shown in FIG. 2.

The signal from the PSKF 106 is then up-converted directly to RF through the IQ mixers 108. The local oscillator (LO) signal from a PLL clocks a programmable divider 110 and subsequently either drives the IQ mixers 108 during WCDMA/EDGE modes or the GSM drivers 112 during GSM mode as shown conceptually in FIG. 4. FIG. 4 is a block diagram of the programmable divider 110 shown in FIG. 2. In the present example, a first multiplexor 170 receives LO and is controlled to pass LO to either a divide by 2 circuit 172 or a divide by 4 circuit 174. The divided outputs are provided to second multiplexor 176, which is controlled to pass one of the divided outputs to IQ mixers 108. The divided outputs from divide by 2 circuit 172 and divide by 4 circuit 174 are provided in parallel to a third multiplexor 178, which is controlled to pass one of the divided outputs to GSM drivers 112. Programmable divider 110 is not limited to having divide by 2 circuit 172 and divide by 4 circuit 174, and can have any number of divider circuits, and a multiplexors configured to receive the divided outputs.

Programmable divider 110 is employed to eliminate dual-path for the low-band and high-band operation and also to enable a single IQ mixer for multi-band operations. The output from the GSM drivers 112 (during GSM mode) are connected to an input of transformer 114 input and subsequently to the transmission (TX) switches 116. To avoid any supply noise coupling to other blocks, voltage regulator 118 is dedicated to the programmable divider 110. The schematic of the IQ mixers 108 with drivers and passive poles is shown in FIG. 5.

Figure 5:
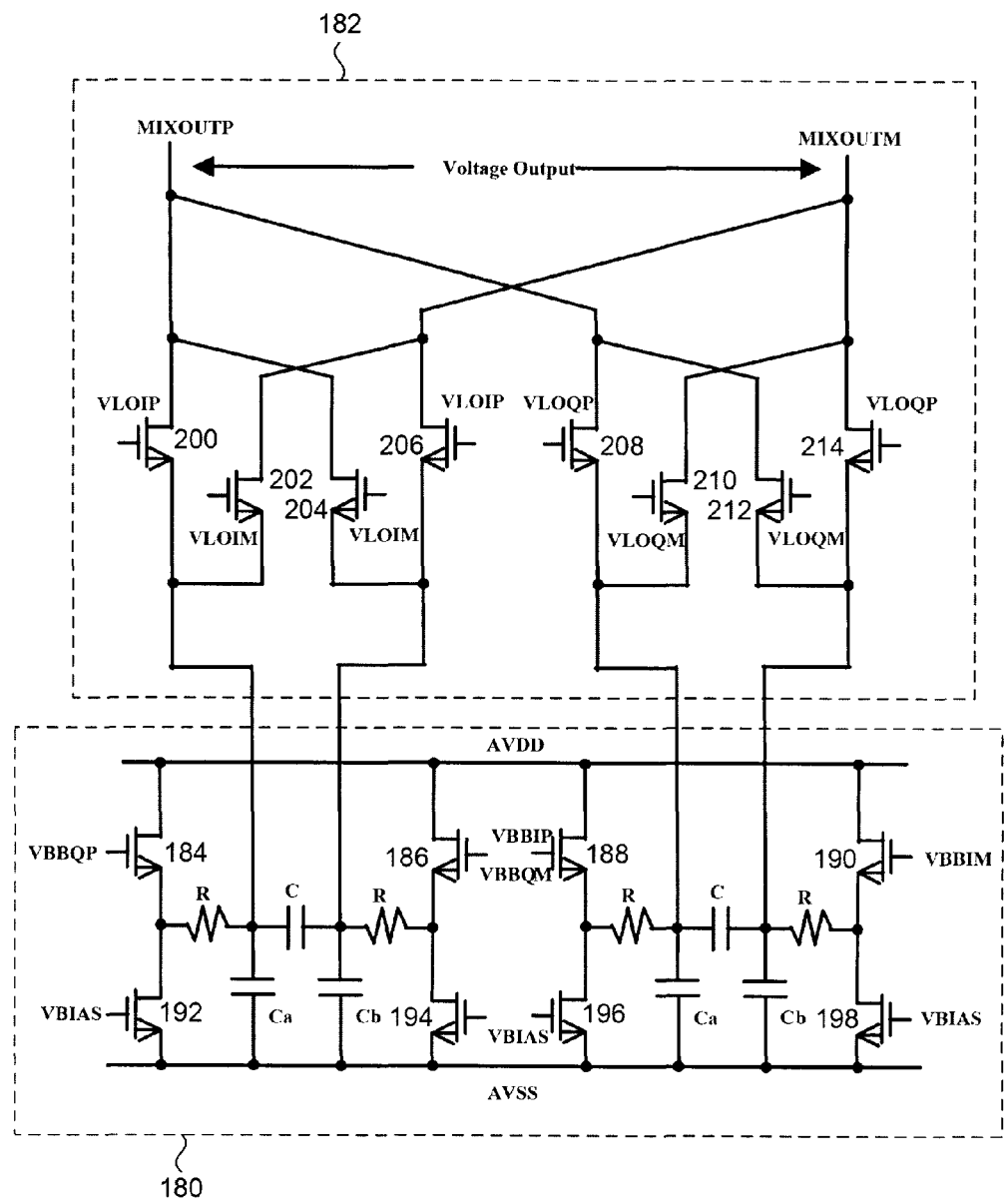
FIG. 5 is a schematic of the IQ mixers shown in FIG. 2.

In FIG. 5, the differential baseband signals for the I and Q paths from the PSKF 106 are labeled VBBQP, VBBQM, VBBIP and VBBIM, which are provided to a driver circuit 180 of IQ mixers 108. The output signals from driver circuit 180 are provided to the passive mixer circuit 182. Those signals drive the source follower NMOS transistors 184, 186, 188 and 190 with current source NMOS transistors 192, 194, 196 and 198. The gates of current source NMOS transistors 192, 194, 196 and 198 receive a bias voltage VBIAS. The resulting outputs are later filtered by passive filters formed by resistor R and capacitors C, Ca-b, before being provided to IQ passive mixer circuit 182. The IQ passive mixer circuit 182 consists of NMOS transistors 200, 202, 204, 206, 208, 210, 212 and 214 for the I/Q paths and clocked by the appropriate LO signals from the programmable divider 110. These LO signals are shown in FIG. 5 as signals VLOIP, VLOIM, VLOQP and VLOQM. It is noted in the present example that the LO signals are differential signals having I and Q components. In the present arrangement, lower sideband suppression is obtained, but upper sideband suppression can be changed easily achieved. With reference to FIG. 2, the differential outputs of passive mixer circuit 182, namely MIXOUTP and MIXOUTM, are voltage outputs that later drive a digital variable gain amplifier (DVGA) 113 through ac-coupling capacitors (shown later in FIG. 8).

Returning to FIG. 5, the presently shown circuit embodiment of IQ mixers 108 has several advantages. From the power supply perspective, the current design can operate from a supply voltage of 1.2V. The dc voltage at the source follower outputs are designed to be as low as possible, but the ac signal can be as large as possible. A large ac signal is effective for suppressing the noise, while a low dc level allows for high linearity or a high overall adjacent channel leakage ratio (ACLR) for the passive mixers because the dc level from the source followers affects the gate-to-source (VGS) voltages for the passive mixer circuit 182 given a fixed maximum voltage at the transistors's gates. In the present embodiment, NMOS transistors 200, 202, 204, 206, 208, 210, 212 and 214 can be natural devices which have a threshold voltage close to zero. Such natural devices can be fabricated from known CMOS processes without any additional mask, thereby minimizing the mask cost component of the total chip cost.

In an example embodiment, the LO signal (VLOIP, VLOIM, VLOQP and VLOQM) is a square waveform from 0V to 1.2V and designed to have low rise and fall times. However, for CMOS processes that do not provide natural devices, a gate boosting technique can be employed to improve the linearity of the IQ mixers 108. The purpose of the additional passive poles, which include resistor R and capacitors C, Ca and Cb, at the output of the source followers is two-fold. First, the resistors slightly reduce the signal swing into the passive mixer circuit 182 to improve its linearity, and indirectly the ACLR. Second, the passive poles which can be programmable, attenuate the wide-band noise from the source followers of driver circuit 180 and the quantization noise from the DAC 102 of FIG. 2. This feature reduces the receiver band's noise and eliminates the need for a SAW filter at the outputs of TX switches 116. It is noted that in the present embodiment of the transmitter of FIG. 2, the receiver band noise is dominated by the noise from the passive mixer circuit 182 in this whole chain arrangement. Since the passive mixers are clocked with LO signals having low rise and fall times which contribute minimum noise, this arrangement enables the omission of the traditional SAW filters at the transmitter's outputs. Accordingly, this helps to minimize the number of required external components, the required the board area, and hence and reduces overall cost of the chip. The source follower drivers of the IQ mixers 108, DAC 108 and the PSKF 106 share a common power supply from voltage regulator 120.

Figure 6:
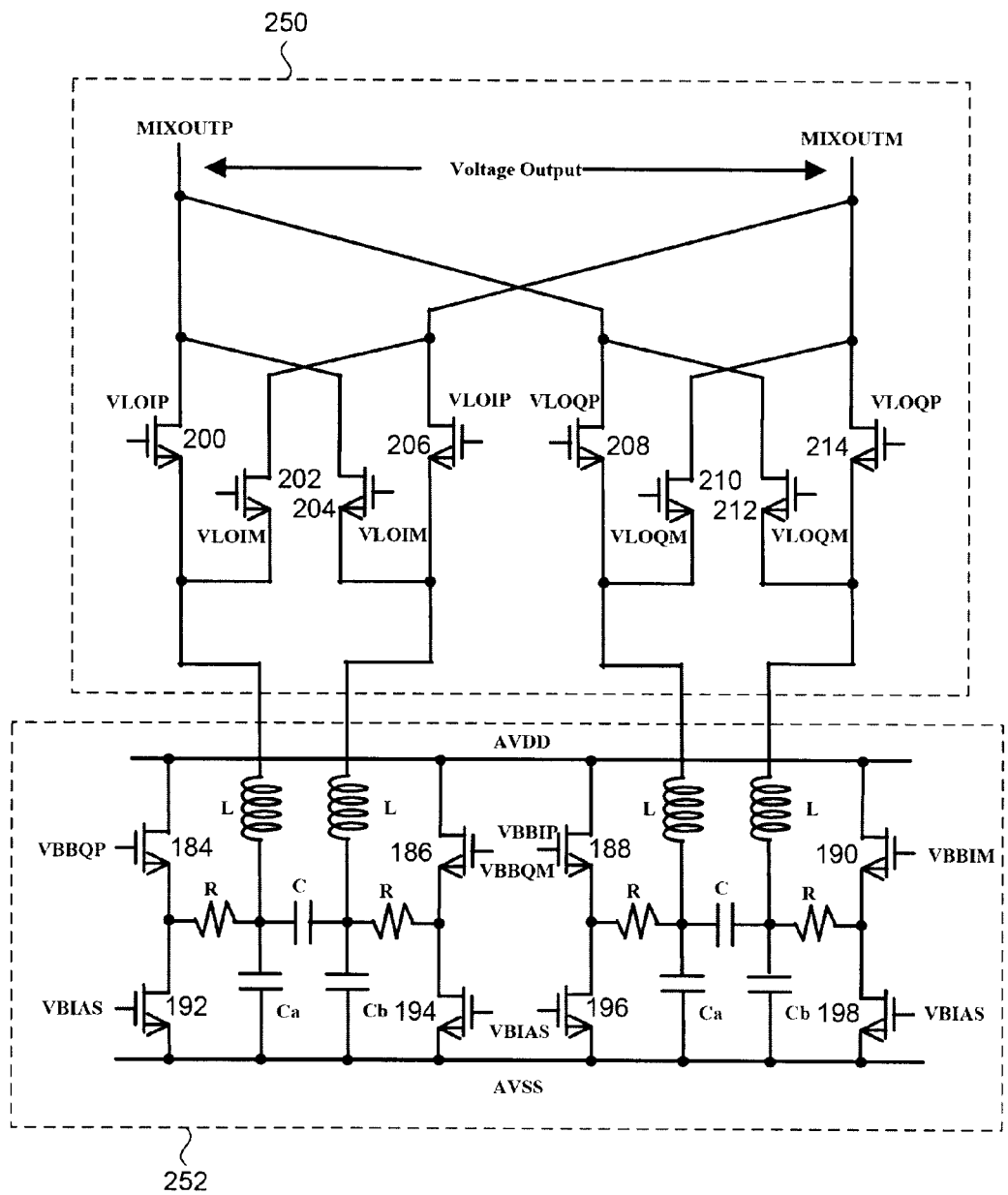
FIG. 6 is a schematic of an alternate IQ mixer circuit.

FIG. 6 is a circuit schematic of IQ mixers 108 according to an alternate embodiment. In this alternate embodiment, passive mixer circuit 250 is identical to that of passive mixer circuit 182 of FIG. 5 and hence uses the same reference numbers for the NMOS transistors. Driver circuit 252 includes the same NMOS transistors, capacitors and resistors arranged in the same configuration as driver circuit 180 of FIG. 5, but now includes additional inductors L. The additional inductors between the drivers and the passive mixer circuit 250 enable the passive mixer circuit 250 to see higher impedances back to the driver circuit 252. This can help improve the ACLR of the passive mixer circuit 250 with the driver circuit 252. It is noted that the additional passive poles are optional, and may be omitted in alternate embodiments by removing capacitances C, Ca and Cb, and by replacing the resistance R with a direct connection to inputs of the passive mixer circuit 182.

Returning to FIG. 2, the output signals from the IQ mixers are provided to DVGA 113, where the signals could be either amplified or attenuated accordingly during transmission via the digital control signals DIG_CTRL from the baseband circuitry. In the present embodiments, DVGA 113 achieves a large dynamic range by having transistors sized specifically sized and/or the bias current being adjusted. The DVGA 113 has transistor sizes scaled and at the same time, the bias current is scaled to reduce the output power to a device matching limit. Because the size of the transistor is fixed to a minimum size, the biasing current can be reduced to further decrease the output power.

Figure 7:
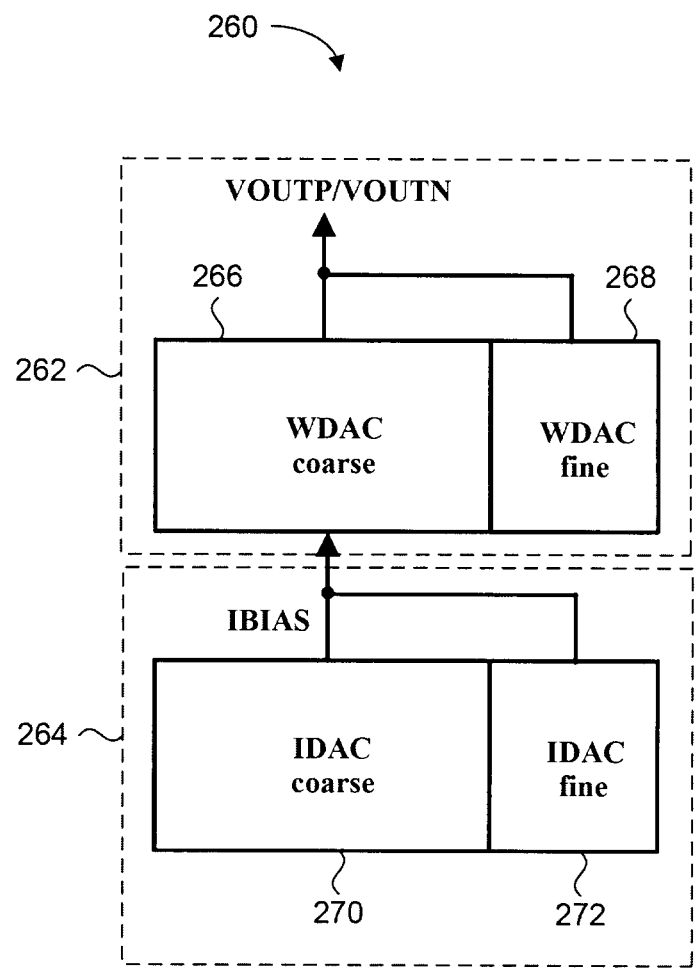
FIG. 7 is a block diagram of the DVGA shown in FIG. 2.
Figure 9:
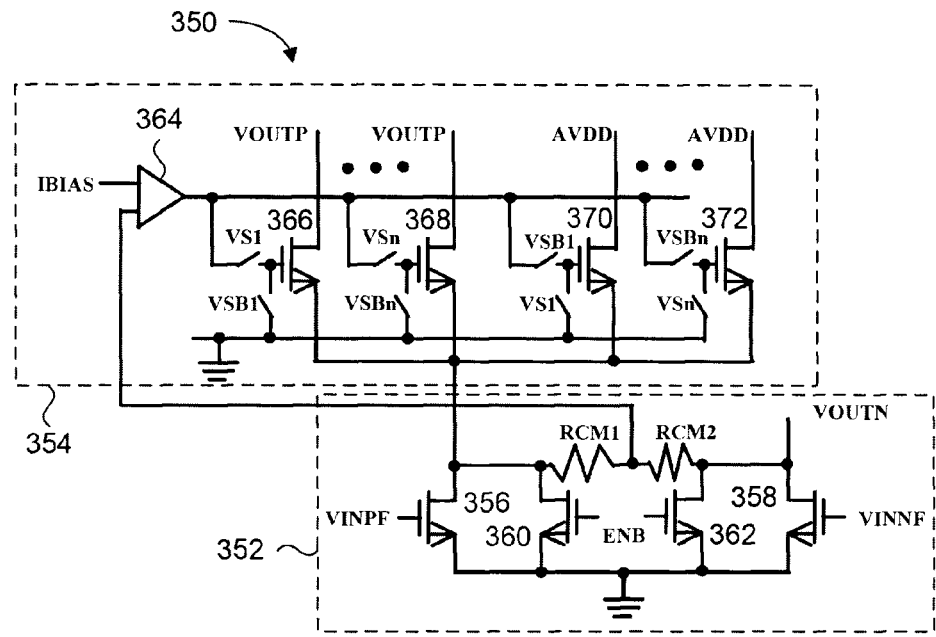
FIG. 9 is a schematic of an alternate WDAC fine sub-block.
Figure 10:
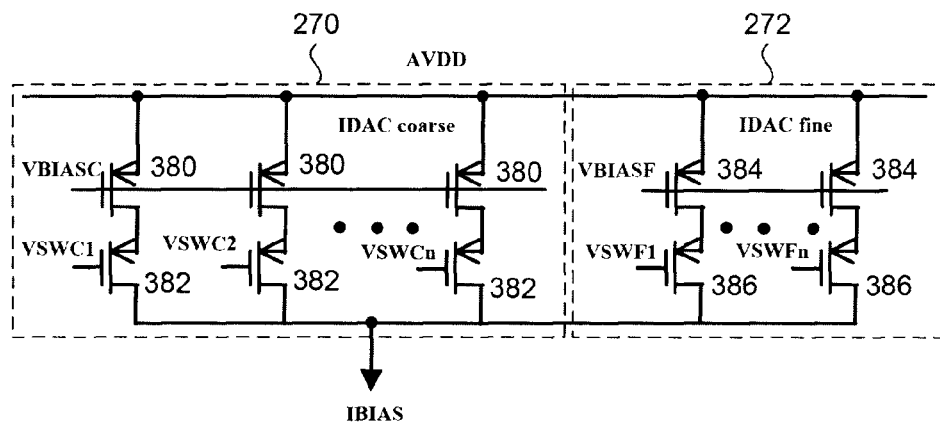
FIG. 10 is a schematic of the IDAC block of FIG. 7.

This concept illustrated in the block diagram of DVGA 113 shown in FIG. 7. The DVGA 260 is subdivided into a WDAC block 262 and an IDAC block 264. The WDAC block 262 is further subdivided into a WDAC coarse sub-block 266 and a WDAC fine sub-block 268. Similarly, the IDAC block 264 is further subdivided into an IDAC coarse sub-block 270 and an IDAC fine sub-block 272. Circuit detail embodiments these blocks of DVGA 113 are shown in FIGS. 8, 9 and 10.

Figure 8:
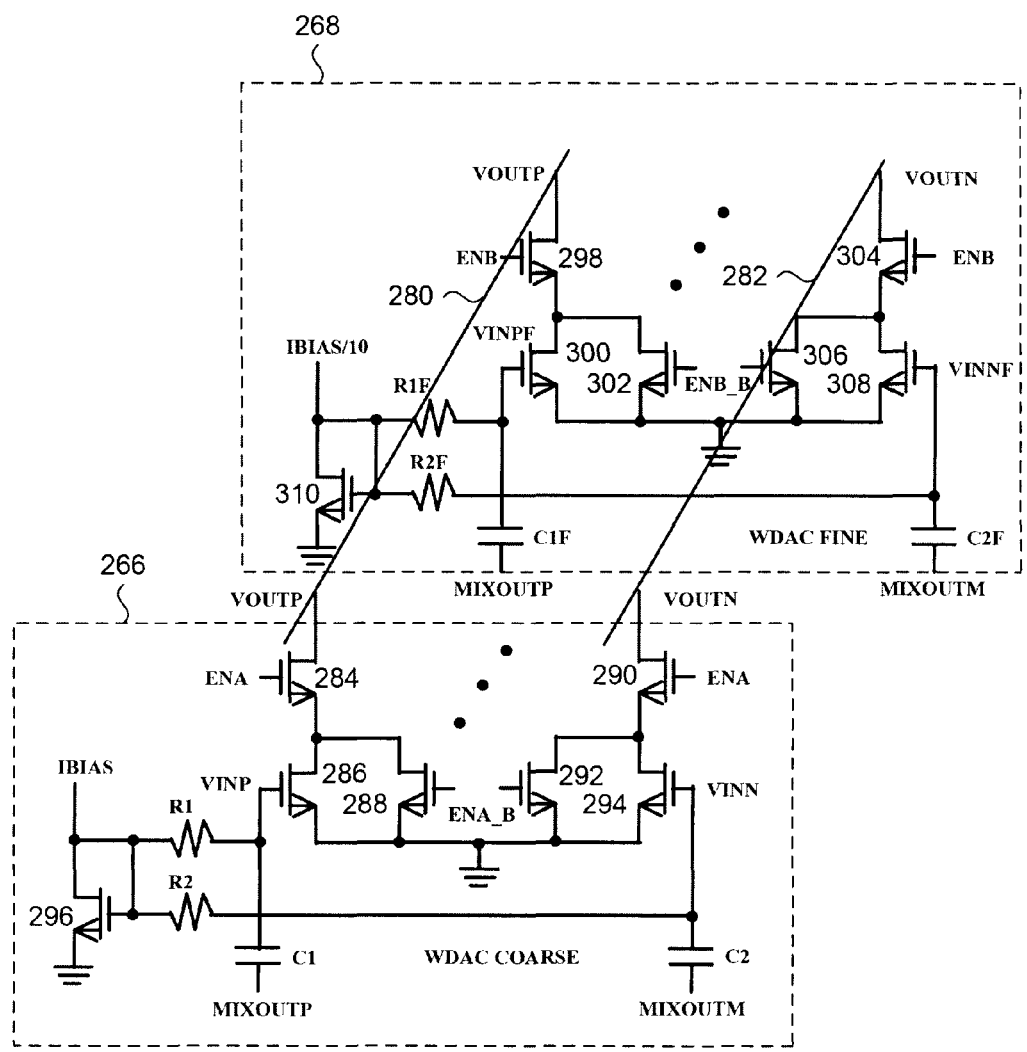
FIG. 8 is a circuit schematic of the DVGA of FIG. 7, according to a present embodiment.

FIG. 8 is a circuit schematic of the WDAC block 262 according to a present embodiment. It is assumed for the present discussion that the current IBIAS is constant, and provided by any known circuit. The outputs of the WDAC coarse sub-block 266 and the WDAC fine sub-block 268 are connected together as shown by output lines 280 and 282. In an example of the present embodiment, the WDAC coarse sub-block 266 consists of N number of unit current cells connected in parallel where N is an integer number, and the WDAC fine sub-block 268 consists of ten unit current cells connected in parallel. FIG. 8 only shows one unit current cell in each of the WDAC coarse sub-block 266 and the WDAC fine sub-block 268. Each unit current cell includes NMOS transistors 284, 286, 288, 290, 292 and 294. The gate terminals of transistors 284 and 290 receive a dedicated enable signal ENA, while the gates of transistors 288 and 292 receive the complement of the enable signal ENA_B. Input transistors 286 and 294 receive input signals VINP and VINN, via capacitors C1 and C2, respectively. Capacitors C1 and C2 receive the MIXOUTP and MIXOUTM outputs of IQ mixers 108. A diode connected NMOS transistor 296 acts as a current source for providing a bias current IBIAS that is provided to the gates of input transistors 286 and 294 of each unit current cell through resistors R1 and R2. With N unit current cells in WDAC coarse sub-block 266, there are N dedicated complementary enable signals ENA and ENA_B. Therefore, any number of the N unit current cells of WDAC coarse sub-block 266 can be enabled to drive VOUTP and VOUTN output lines 280. In the present embodiments, N is determined by the desired output dynamic range, and the dedicated complementary enable signals ENA and ENA_B can be provided as part of DIG_CTRL to enable any number of the N unit current cells. For example, to achieve dynamic range of 45 dB, N is changed from 512 to 3 through the control word. Note also that all transistors are sized the same to obtain device matching in the present embodiment.

The WDAC fine sub-block 268 is similarly configured to WDAC coarse sub-block 266, and receives in parallel input signals RFINP and RFINN. Each unit current cell of WDAC fine sub-block 268 includes NMOS transistors 298, 300, 302, 304, 306 and 308 configured in the same manner as NMOS transistors 284, 286, 288, 290, 292 and 294. The gate terminals of transistors 298 and 304 receive an enable signal ENB, while the gates of transistors 302 and 306 receive the complement of the enable signal ENB_B. Input transistors 300 and 308 receive input signals VINPF and VINNF, via capacitors C1F and C2F, respectively. Capacitors C1F and C2F receive the MIXOUTP and MIXOUTM outputs of IQ mixers 108 A diode connected NMOS transistor 312 acts as a current source for providing a bias current IBIAS/10 that is provided to the gates of input transistors 300 and 308 of each cell through resistors R1F and R2F. In the present embodiment where there are ten unit current cells in WDAC fine sub-block 268, there are ten corresponding dedicated complementary enable signals ENB and ENA_B. Therefore, any number of the ten unit current cells of WDAC fine sub-block 268 can be enabled to drive VOUTP and VOUTN output lines 280. Accordingly, the dedicated complementary enable signals ENB and ENB_B can be provided as part of DIG_CTRL to enable any number of the ten unit current cells. The set of dedicated complementary enable signals ENA and ENA_B and the set of dedicated complementary enable signals ENB and ENB_B are referred to as a number of unit (NOU) code.

The WDAC fine sub-block 268 is biased with 1/10 of the IBIAS current, and hence the dc gate voltages to VINP, VINN and VINPF, VINNF are different. Consequently, different resistors R1F and R2F and capacitors C1F and C2F are used for the WDAC fine sub-block 268. While the embodiment of FIG. 8 can achieve the desired DVGA operation the current densities of the transistors in the WDAC coarse sub-block 266 and WDAC fine sub-block 268 can be different due to the manufacturing process. Thus it is possible that RF performance between the WDAC coarse sub-block 266 and the WDAC fine sub-block 268 will differ, thereby causing potential nonlinear delta errors between NOU codes within signal DIG_CTRL that change the number of unit current cells being activated.

FIG. 9 illustrates an alternative embodiment of the WDAC fine sub-block 268 of FIG. 8. This alternate WDAC fine sub-block 350 minimizes this delta error and consists of a single input cell 352 and a current steering block 354. The input cell 352 includes NMOS transistors 356, 358, 360 and 362, and resistors RCM1, RCM2. The input cell 352 is similar in configuration to a unit current cell of the WDAC fine sub-block 268, but omits the NMOS transistors that selectively couple the cell outputs to output lines 280 and 282. Furthermore, resistors RCM1 and RCM2 couple the drain terminals of both transistors 356 and 358 to a common node that is fed back to the current steering block 354. The current steering block 354 includes an operational amplifier (op-amp) 364, a set of first NMOS steering transistors 366 to 368, a set of second NMOS steering transistors 370 to 372, and a first set of switch element pairings VS1/VS1B to VSn/VSBn, and a second set of switch element pairings VSB1/VS1 to VSBn/VSn. It is noted that only a portion of the schematic is shown, and that VOUTN is connected transistors and switch elements having the same configuration as NMOS steering transistors 366 to 368, NMOS steering transistors 370 to 372, the first set of switch element pairings VS1/VS1B to VSn/VSBn, and the second set of switch element pairings VSB1/VS1 to VSBn/VSn. In the present example, variable "n" is 10. For the listed switch pairings, the first switch label corresponds to the switch element that connects the gates of the first and second sets of NMOS transistors to the output of the op-amp 364, while the second switch label corresponds to the switch element that connects the gates of the first and second sets of NMOS transistors to VSS. In the presently used naming convention, the additional letter "B" in the switch labels represents the complement of the root label name. For example, VSB1 is the complement of VS1.

The WDAC fine sub-block 350 has a common mode feedback to op-amp 364, and a current steering block 354 which replaces the cascode transistors (eg. Transistors 298 and 304) in the unit current cell of FIG. 8. The transistor's sizes in the input cell 352 are the same as the corresponding transistors WDAC coarse sub-block 266 of FIG. 8 so that both circuits have the same RF performances. Typically, transistors 356 and 358 are minimally sized, and thus those transistors have large channel modulation effects that could affect the delta error between codes. A common mode feedback circuit which consists of resistors RCM1, RCM2 and op-amp 364 is used to set the drain voltages of NMOS transistors 356 and 358 to be the same as the drain voltage of transistor 296 in FIG. 8. This is achieved by adjusting the gate voltages of the current steering block 354 via op-amp 364 and enabling/disabling of the switch elements VS1 to VSn and VSB1 to VSBn. The op-amp 364 has a reference voltage set to IBIAS, which is the drain voltage of transistor 296 in FIG. 8. When all the transistors 366 to 368 are on and all the transistors 370 to 372 are off, all the current from transistor 356 is provided to VOUTP and thus the WDAC fine sub-block 354 is contributing the same output power as all ten enabled unit current cells of WDAC fine sub-block 268 of FIG. 8.

Conversely, if all the transistors 366 to 368 are off and all the transistors 370 to 372 are on, the current from 356 is dumped to AVDD and the WDAC fine sub-block 354 is now delivering zero power. In another possible scenario, if one of the transistors 366 to 368 is on with the rest turned off, and one of the transistors 370 to 372 is turned off while the rest are turned on, then 1/10 of the power from transistor 356 is delivered to VOUTP. This would be equivalent to having one unit current cell in WDAC fine sub-block 268 being enabled. For the embodiment of FIG. 9, the NOU code includes the set of dedicated complementary enable signals ENA/ENA_B and the set of selection signals for enabling or disabling switch elements VS1 to VSn and VSB1 to VSBn.

Accordingly, the presently shown DVGA embodiments could implement an NOU value of 12.3 for example. Here, 12 unit current cells in the WDAC coarse sub-block 266 of FIG. 8 are selected to be turned on, and in the WDAC fine sub-block 350 of FIG. 9, only three of the transistors 366 to 368 are on while only three of the transistors 370 to 372 are turned off. Hence the WDAC coarse sub-block 266 contributes 12 units of current while the WDAC fine sub-block 354 contributes the 0.3 unit of current. This is due to the fact that in the presently described example configuration, the WDAC fine sub-block 354 (or WDAC fine sub-block 268) only receives 1/10 the IBIAS current, hence each current steering transistor (or unit current cell) provides 1/10 output current.

One of the advantages of the present embodiment is that the current steering block 354 does not require a high level of device matching, and the DVGA dynamic range is easily extended by more than 20 dB relative to an embodiment where only the WDAC coarse sub-block 266 is used. With the common mode circuit, the delta error is reduced and monotonicity is maintained.

In the presently described embodiment of DVGA 260, it has been assumed that IBIAS is constant. The output dynamic range can be further expanded when the IBIAS current that supplies the WDAC block 262 is either increased or reduced.

FIG. 10 is a circuit schematic of IDAC block 264 of FIG. 7 that consists of IDAC coarse sub-block 270 and IDAC fine sub-block 272 that supplies an adjustable (BIAS to the WDAC block 262. In the present embodiment, the current sources are cascaded, however different arrangements may be used depending on the current accuracy requirement of the application. Each current source of IDAC coarse sub-block 270 includes a first PMOS transistor 380 and a second PMOS transistor 382 connected in series between the AVDD voltage the IBIAS node. There can be any number of current sources in IDAC coarse sub-block 270. Similarly, each current source of IDAC fine sub-block 272 includes a first PMOS transistor 384 and a second PMOS transistor 386 connected in series between the AVDD voltage the IBIAS node. There can be any number of current sources in IDAC fine sub-block 272. The first PMOS transistors of the IDAC coarse sub-block 270 are controlled by bias voltage VBIASC, while the first PMOS transistors of the IDAC fine sub-block 272 are controlled by a different bias voltage VBIASF. The second PMOS transistors of the IDAC coarse sub-block 270 are turned on and off by different control signals VSWC1, VSWC2 to VSWCn, where n is any integer value of at least 1. Similarly, the second PMOS transistors of the IDAC fine sub-block 272 are turned on and off by different control signals VSWF1, VSWF2 to VSWFn. In the present embodiment, control signals VSWF1 to VSWFn are included in the DIG_CTRL signal provided by the base band processor. Therefore, any number of current sources in IDAC coarse sub-block 270 and IDAC fine sub-block 272 can be turned on to tailor the current IBIAS.

In the present example, each unit current source in the IDAC fine sub-block 272 is 1/10 of the unit current source in the IDAC coarse sub-block 270. This can be achieved by adjusting VBIASF relative to VBIASC for example. The current ratio for the particular application can be generated depending on a current mirror ratio that one skill in the art that can easily manipulate. In an alternative embodiment, the IDAC fine sub-block 272 can employ the circuit techniques used for the current steering block 354 of FIG. 9. In other-words, a series of steering transistors and switch elements can be arranged to enable selective enabling of the steering transistors and dumping of current, as part of the fine current contribution to IBIAS.

Figure 11:
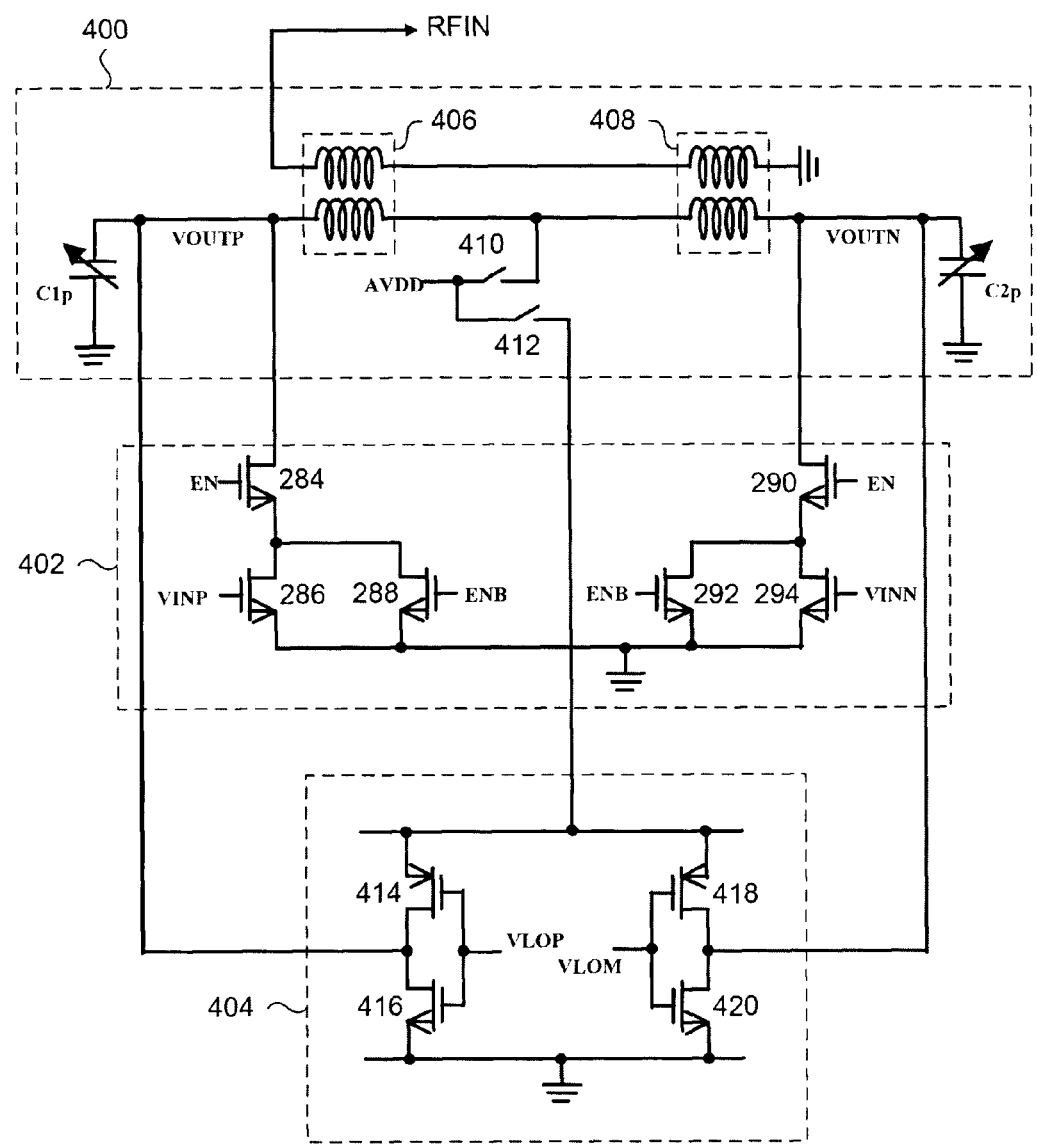
FIG. 11 is a circuit schematic of the transformer of FIG. 2 interconnected with the DVGA and GSM driver of FIG. 2.

As shown in FIG. 2, the differential outputs VOUTP and VOUTN from DVGA 113 combined with the differential output GSM_OUT from the GSM drivers are provided to the input of the transformer 114. FIG. 11 is a circuit schematic showing the interconnection of transformer 114 with the GSM drivers 112 and DVGA 113, according to a present embodiment. The circuit for transformer 114 is shown in box 400, and converts differential signals into a single-ended signal RFIN, and can have a turn ratio of 1:n. A simplified schematic of DVGA 113 is shown in box 402, while a simplified schematic of GSM drivers 112 is shown in box 404. Transformer 400 includes inductively coupled coil pairs 406 and 408, programmable capacitances C1p and C2p, and a GSM drivers enabling switch circuit consisting of complementary switch elements 410 and 412. Each coil pair includes a primary coil and a secondary coil, as should be known by persons skilled in the art. Transformer 400 receives as inputs VOUTP and VOUTN provided from either DVGA or GSM drivers 404.

The transformer 400 is designed to have tuning capabilities, and with programmable capacitances C1p and C2p, output power can be maximized while minimizing loss. It is noted from FIG. 2 that a voltage regulator 122 provides the AVDD and AVSS supply to transformer 400. The GSM drivers enabling switch circuit connects the centre tap of the primary transformer to the voltage supply AVDD through switch element 412 during WCDMA/EDGE modes of operation. Hence GSM drivers 404 is disabled or turned off because switch element 412 is open to disconnect it from AVDD. Alternately, the outputs of GSM drivers 404 can be tristated in response to the signal controlling switch element 412. During the GSM mode of operation, the GSM drivers 404 is turned on by connecting its power supply rail to AVDD by closing switch element 412. Switch element 410 is open, and DVGA 402 is turned off by setting enable signal EN to the low logic level and its complement ENB to the high logic level.

The simplified DVGA 402 shows a unit current cell of the WDAC coarse block 266 from FIG. 8, and intentionally omits the other circuits to simplify the schematic. Accordingly, the same reference numbers used in FIG. 8 designate the same circuit elements in DVGA 402 of FIG. 11. The simplified GSM drivers 404 includes a pair of CMOS inverters, the first having a PMOS transistor 414 and an NMOS transistor 416, and the second having a PMOS transistor 418 and an NMOS transistor 420. The first CMOS inverter receives digital input signal VLOP while the second CMOS inverter receives digital input signal VLOM. Both VLOP and VLOM are differential signals directly related to digital signals provided from the base band processor.

Figure 12:
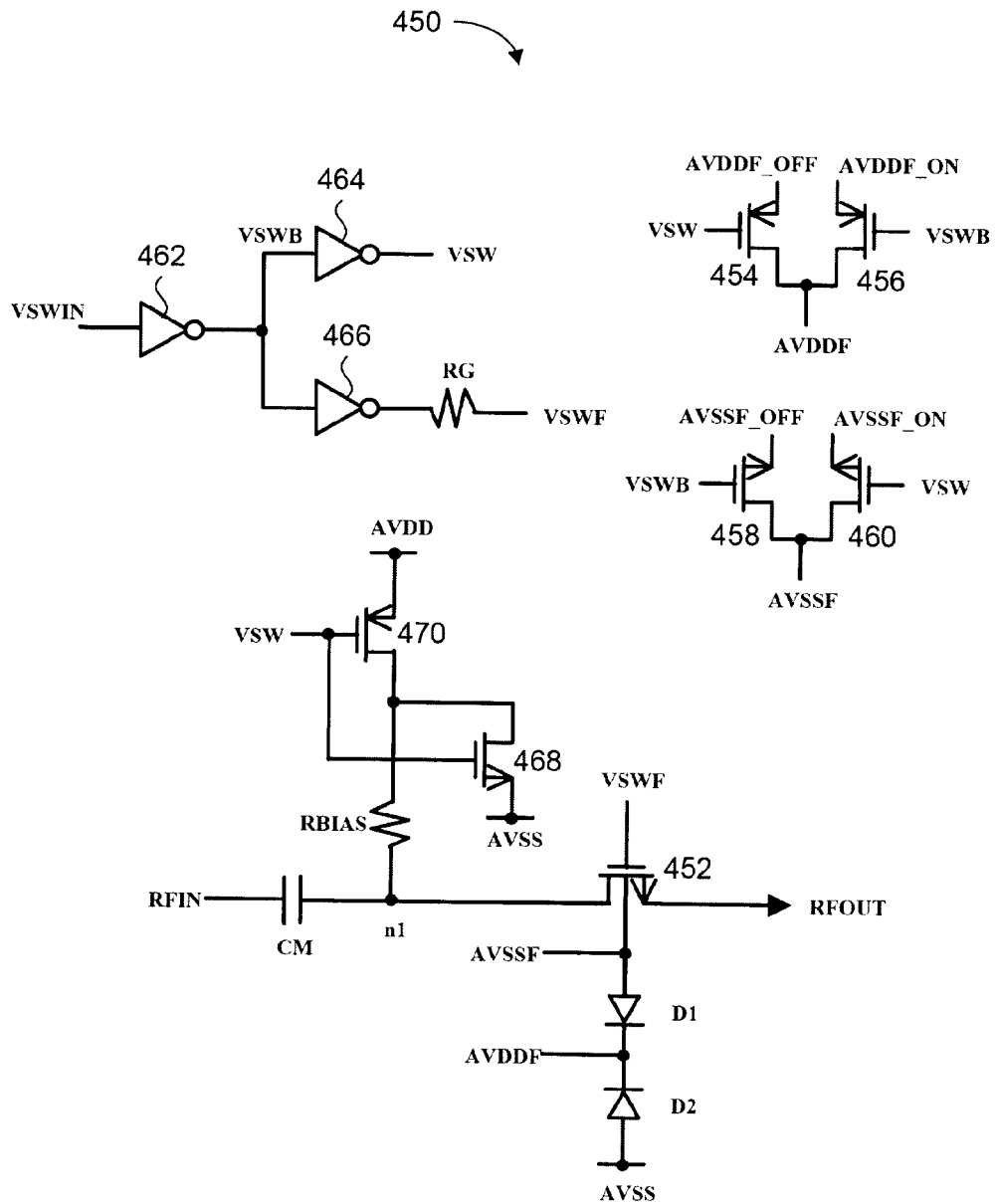
FIG. 12 is a circuit schematic of a TX switch shown in FIG. 2.

Finally, the single-ended output RFIN from the transformer 400 is connected to multi-mode multi-band outputs via TX switches 116 of FIG. 2. Each TX switch of the present embodiment uses unique biasing schemes together with deep n-well technologies to enable low-loss design while operating from a low supply voltage. Furthermore, a separate voltage regulator 124 provides the AVDD and AVSS supplies. With a digital decoder circuit, the TX switches 116 enables the transmitter to operate in a convergence mode. A circuit schematic of one TX switch 450 is shown in FIG. 12 with its corresponding symbol shown in FIG. 13. As shown in FIG. 12, the RF input, RFIN is coupled to the output RFOUT via coupling capacitor CM and switch transistor 452. Transistor 452 is an NMOS transistor formed in its own well. In the present embodiment, diode D1 is formed from a p-well to the deep n-well junction, and diode D2 is formed from the deep n-well to the p-substrate junction. Both diodes are biased as shown in FIG. 12. The AVDDF and AVSSF voltages are connected to either noise resistant voltages AVDDF_OFF or AVDDF_ON and AVSSF_OFF or AVSSF_ON respectively, via PMOS transistors 454, 456, 458 and 460, where their gates are connected to complementary switch signals VSW and VSWB as shown in FIG. 12. The switch control input VSWIN is connected to three inverters 462, 464 and 466 to generate control voltages of VSW and VSWF. It is noted that VSWF is connected to the output of inverter 466 via resistor RG to generate a floating voltage.

Following is a description of the operation of the TX switch circuits of FIG. 12. When the TX switch is turned on, namely when VSWIN is at a high logic level, node n1 is pulled to ground through resistor RBIAS and transistor NMOS transistor 468. Transistor 450 is turned on via the gate-boosted voltage from VSWF, and consequently the signal RFIN is passed to the output RFOUT, with minimum loss. The AVDDF and AVSSF nodes are connected to AVDDF_ON and AVSSF_ON respectively. Conversely, when the TX switch is turned off, namely when VSWIN is at a low logic level, node n1 is pulled to AVDD through resistor RBIAS and PMOS transistor 470. Transistor 450 is turned off because VSWIN is at the low logic level, and consequently the signal RFIN does not pass to the output RFOUT. The AVDDF and AVSSF nodes at this time are connected to AVDDF_OFF and AVSSF_OFF respectively. Voltage nodes AVDDF_OFF, AVDDF_ON, AVSS_OFF and AVSSF_ON are derived from the AVDD and AVSS supply voltage respectively, via resistor elements RAVDD and RAVSS. In the present example, it is assumed that multiple TX switches identical to the one of FIG. 12 have their inputs connected together, therefore node n1 should be pulled either to AVDD or AVSS. Furthermore, transistors 454, 456, 458 and 460 are used to minimize coupling between AVDDF_OFF and AVDDF_ON, and between AVSSF_OFF and AVSSF_ON that could reduce the input-output isolation of the TX switches when it is turned off. This because in an embodiment where an array of TX switches of FIG. 12 are used, there is the possibly that some TX switches are turned on and some are turned off.

Figure 13:
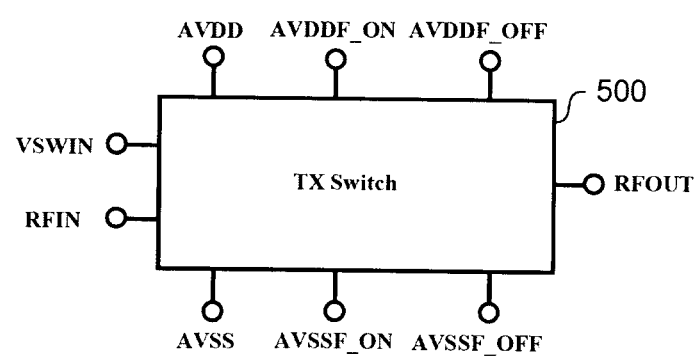
FIG. 13 shows the symbol of the TX switch of FIG. 12.
Figure 14:
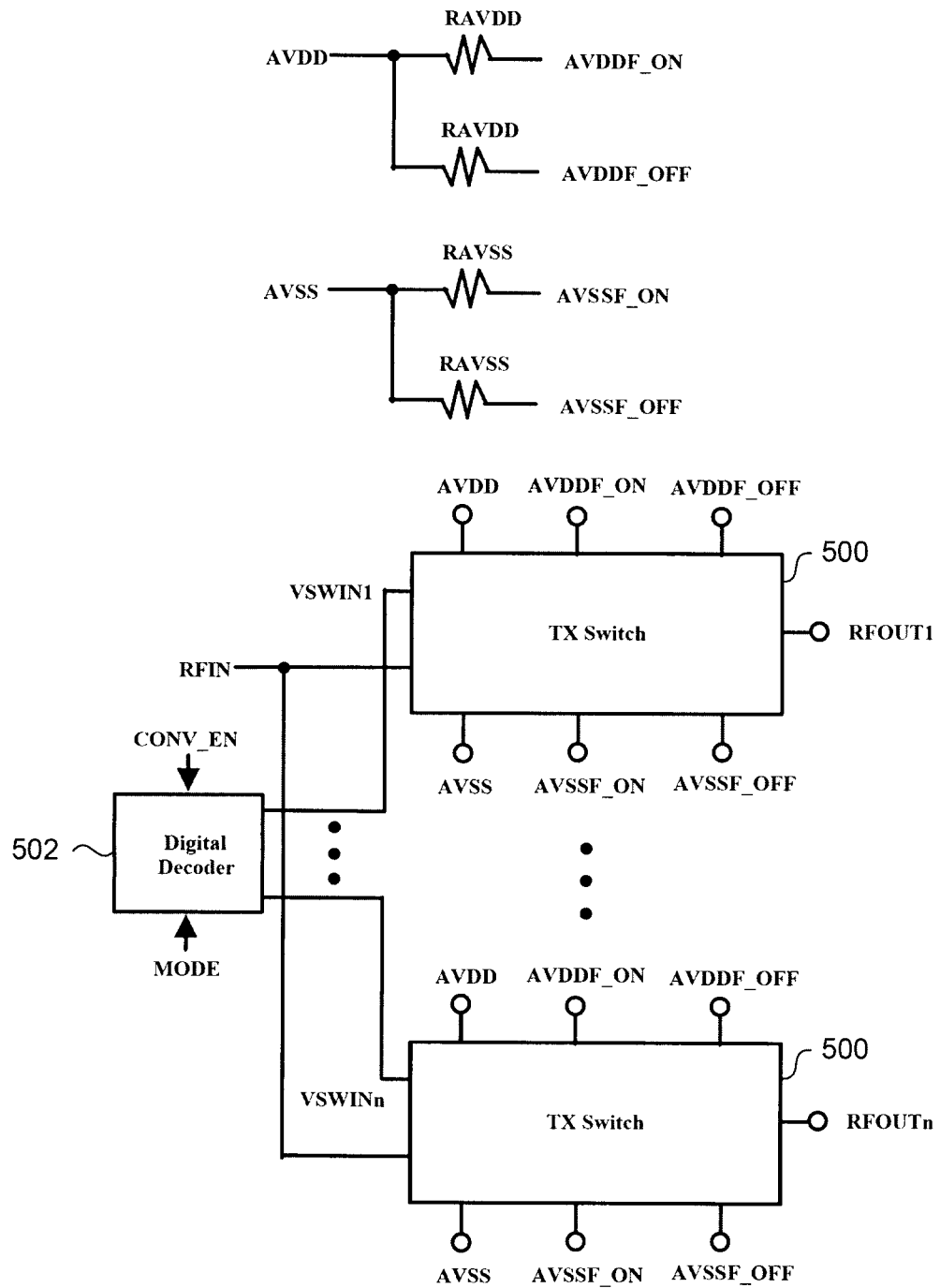
FIG. 14 illustrates an array of selectable TX switches, according to a present embodiment.

FIG. 14 shows an array of TX switches 500 represented by the symbol of FIG. 13, where all their RF input terminals are connected together to RFIN with n outputs. Accordingly, the first output is RFOUT1 and the last output is RFOUTn. There are n corresponding control inputs VSW1 to VSWn generated by a digital decoder 502. The inputs to the digital decoder 502 are convergence enable signal CONV_EN and mode/band select signal MODE. When convergence enable is off, the control inputs from the mode/band select will pass RFIN to its desired output. For example, if RFOUT1, RFOUT2, RFOUT3, RFOUT4 and RFOUT5 are set for GSM/EDGE low bands, GSM/EDGE high bands, WCDMA low bands, WCDMA middle bands and WCDMA high bands respectively, and the desired output is GSM/EDGE low bands, the decoder will turn on the TX switch 500 that connects RFIN to RFOUT1. When convergence enable is on, all the WCDMA low bands are passed to RFOUT1, and all the WCDMA middle and high bands are passed to RFOUT2. This arrangement of TX switches enables the transmitter to implement convergence mode easily, while conserving silicon area and board area.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A multi-standard transmitter core, comprising
a filter for receiving and filtering a differential transmission signal in accordance with a first standard of at least two different communication standards, the filter providing a differential filtered transmission signal;
a mixer for receiving and upconverting the differential filtered transmission signal with an adjusted oscillator frequency for the first standard, the mixer providing a differential upconverted transmission signal;
a digital variable gain amplifier (DVGA) for receiving the differential upconverted transmission signal and applying a gain factor to provide a first differential output signal for the first standard wherein the filter, mixer, and digital variable gain amplifier provide a first path for providing the first differential output signal;
a digital driver circuit for providing a second differential output signal corresponding to a second of the at least two communication standards in response to a digital transmission signal in accordance with the second standard wherein the digital driver circuit provides a second path for providing the second differential output signal;
a transformer; and
a switch circuit for receiving the first and second differential output signals and selectively supplying one of the first differential output signal and the second differential output signal to the transformer, the transformer having a primary coil and a secondary coil for converting one of the first differential output signal and the second differential output signal to a single-ended output signal.

2. The multi-standard transmitter core of claim 1, further including a programmable divider for receiving a local oscillator frequency and converting the local oscillator frequency into the adjusted oscillator frequency for one of the mixer and the digital driver circuit.

3. The multi-standard transmitter core of claim 1, wherein the second standard is a GSM standard, and the digital driver circuit is a GSM driver circuit.

4. The multi-standard transmitter core of claim 1, wherein the transformer includes the switch circuit, the switch circuit selectively connecting a voltage supply to a centre tap of the primary coil during operation of the first standard while disabling the digital driver circuit, the switch circuit enabling the digital driver circuit during operation of the second standard while disconnecting the voltage supply from the centre tap.

5. The multi-standard transmitter core of claim 1, wherein the transformer includes tunable capacitances connected to inputs of the transformer.

6. The multi-standard transmitter core of claim 1, wherein the mixer includes a driver circuit and a passive mixer, the driver circuit driving the differential filtered transmission signal through a passive mixer, the passive mixer receiving the adjusted oscillator frequency to provide the differential upconverted transmission signal.

7. The multi-standard transmitter core of claim 6, wherein the driver circuit includes input stages for providing corresponding outputs to passive filters, the passive filters having outputs coupled to the passive mixer.

8. The multi-standard transmitter core of claim 7, wherein the driver circuit includes inductors connected between the outputs of the passive filters and the passive mixer.

9. The multi-standard transmitter core of claim 1, wherein the DVGA includes
a coarse gain block for providing a first current to differential output nodes in response to the differential upconverted transmission signal, the differential output nodes corresponding to the first differential output signal, and,
a fine gain block for providing a second current to the differential output nodes in response to the differential upconverted transmission signal, the gain of the first differential output signal being a sum of an integer factor of a received bias current and a fraction of the bias current.

10. The multi-standard transmitter core of claim 9, wherein the coarse gain block includes a predetermined number of unit cells, each unit cell being selectively enabled to add one unit of the received bias current to the differential output nodes.

11. The multi-standard transmitter core of claim 9, wherein the fine gain block includes a predetermined number of unit cells, each unit cell being selectively enabled to add one fraction of the received bias current to the differential output nodes.

12. The multi-standard transmitter core of claim 9, wherein the fine gain block includes a current steering circuit having
a first set of N transistors connected in parallel between the differential output nodes and input transistors receiving the differential upconverted transmission signal, where N is an integer number greater than 1,
a second set of N transistors connected in parallel between a voltage supply and the input transistors,
switch elements for enabling M transistors of the first set of N transistors, and for enabling N-M transistors of the second set of N transistors, where M is less than or equal to N, and
an op-amp receiving the bias current and a common mode feedback signal from one of the input transistors for driving gate terminals of the enabled M transistors and the N-M transistors.

13. The multi-standard transmitter core of claim 9, wherein the DVGA includes a current block for adjusting the bias current.

14. The multi-standard transmitter core of claim 13, wherein the current block includes a coarse current sub-block for providing a coarse current in response to a first bias voltage, and a fine current sub-block for providing a fine current in response to a second bias voltage different than the first bias voltage, the bias current being a sum of the coarse current and the fine current.

15. The multi-standard transmitter core of claim 14, wherein the coarse current sub-block includes first individual current sources selectively enabled to provide the coarse current, and the fine current sub-block includes second individual current sources selectively enabled to provide the fine current.

16. The multi-standard transmitter core of claim 1, wherein the filter is programmable to adjust a corresponding corner frequency and Q parameter for the first standard.

17. The multi-standard transmitter core of claim 16, wherein the filter is a PSKF filter.

18. The multi-standard transmitter core of claim 1, further including a first transmission switch corresponding to the first standard and a second transmission switch corresponding to the second standard, the single-ended output signal being passed through one of the first transmission switch and the second transmission switch.

19. The multi-standard transmitter core of claim 18, further including a decoder for enabling at least one of the first transmission switch and the second transmission switch in response to an operating mode of the multi-standard transmitter core.

20. The multi-standard transmitter core of claim 19, wherein each of the first transmission switch and the second transmission switch includes a switch transistor for coupling the single-ended output signal to a transmission output when enabled by the decoder.

21. The multi-standard transmitter core of claim 20, wherein the switch transistor is an NMOS transistor formed in a dedicated p-well, the p-well being formed in an n-well, and the n-well is formed in a p-substrate.

22. The multi-standard transmitter core of claim 21, wherein the dedicated p-well is selectively coupled to one of a first noise resistant ground voltage and a second noise resistant ground voltage, and the p-well is connected to a VSS voltage supply.

23. The multi-standard transmitter core of claim 21, wherein the n-well is selectively coupled to one of a first noise resistant positive voltage and a second noise resistant positive voltage, and the p-well is connected to a VSS voltage supply.

24. The multi-standard transmitter core of claim 23, wherein each of the first transmission switch and the second transmission switch includes a voltage coupling circuit for selectively coupling the one of the first noise resistant positive voltage and the second noise resistant positive voltage to the n-well, the first noise resistant positive voltage being selected when the switch transistor is enabled by the decoder, the second noise resistant positive voltage being selected when the switch transistor is disabled by the decoder.

* * * * *